(12) United States Patent
Oshida et al.

(10) Patent No.: US 8,357,991 B2
(45) Date of Patent: Jan. 22, 2013

(54) SEMICONDUCTOR DEVICE HAVING INTERCONNECT STRUCTURE FOR MIM CAPACITOR AND FUSE ELEMENTS

(75) Inventors: Daisuke Oshida, Kanagawa (JP);
Hiroyuki Kunishima, Kanagawa (JP);
Norio Okada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 91 days.

(21) Appl. No.: 12/616,942

(22) Filed: Nov. 12, 2009

(65) Prior Publication Data

US 2010/0117191 A1 May 13, 2010

(30) Foreign Application Priority Data

Nov. 12, 2008 (JP) .................................. 2008-289531

(51) Int. Cl.
*H01L 23/52* (2006.01)
(52) U.S. Cl. ........... 257/529; 257/E23.149; 257/E23.15; 257/E21.592
(58) Field of Classification Search .................. 257/529, 257/532, 535, 306, 530, 209, E23.15, E23.149, 257/E21.592, E23.147, E23.148
See application file for complete search history.

(56) References Cited

U.S. PATENT DOCUMENTS

| | | | |
|---|---|---|---|
| 6,426,249 B1 * | 7/2002 | Geffken et al. | 438/239 |
| 6,853,051 B2 * | 2/2005 | Shioga et al. | 257/532 |
| 2002/0159316 A1 * | 10/2002 | Weinrich | 365/200 |
| 2005/0093091 A1 * | 5/2005 | Badami et al. | 257/529 |
| 2006/0130303 A1 * | 6/2006 | Yamasaki et al. | 29/25.41 |

FOREIGN PATENT DOCUMENTS

| | | |
|---|---|---|
| JP | 07-078872 | 3/1995 |
| JP | 2003-273220 | 9/2003 |
| JP | 2004-128498 | 4/2004 |

* cited by examiner

*Primary Examiner* — Calvin Lee
*Assistant Examiner* — Scott Stowe
(74) *Attorney, Agent, or Firm* — Young & Thompson

(57) ABSTRACT

A semiconductor device includes an upper interconnect, a lower interconnect, insulating layers interposed between the upper interconnect and the lower interconnect, a connecting portion that is formed in the insulating layers and connects the upper interconnect and the lower interconnect, and an element that is placed in one of the insulating layers and has a conductive layer connected to the connecting portion. The connecting portion is formed over the lower interconnect and the end portions of the conductive layer of the element, and is in contact with the upper face of the lower interconnect and the upper faces and side faces of the end portions of the conductive layer of the element.

14 Claims, 2 Drawing Sheets

US 8,357,991 B2

SEMICONDUCTOR DEVICE HAVING INTERCONNECT STRUCTURE FOR MIM CAPACITOR AND FUSE ELEMENTS

This application is based on Japanese patent application No. 2008-289531, the content of which is incorporated herein by reference.

BACKGROUND

1. Technical Field

The present invention relates to a semiconductor device.

2. Related Art

Conventionally, various elements are placed in the insulating layer interposed between the upper interconnects and the lower interconnects in a semiconductor device.

Examples of the elements are fuse elements and MIM capacitors.

Those elements are connected to vias in the insulating layers, and are connected to the upper interconnects and the lower interconnects through the vias (see Japanese Laid-Open Patent Publication Nos. 2003-273220 and 2004-128498, for example).

More specifically, as shown in FIG. 4, vias 901 penetrate through an element 900 (a fuse element in this example), and the element 900 is in contact with the side faces of the vias 901. The upper end portions of the vias 901 are connected to upper interconnects 902, and the lower end portions of the vias 901 are connected to lower interconnects 903.

In FIG. 4, reference numerals 904 through 906 indicate insulating layers.

However, the semiconductor devices disclosed in Japanese Laid-Open Patent Publication Nos. 2003-273220 and 2004-128498 have the following problems.

In the semiconductor devices disclosed in Japanese Laid-Open Patent Publication Nos. 2003-273220 and 2004-128498, the vias 901 penetrate through the element 900, and the contact areas between the vias 901 and the element 900 are small. Therefore, it is difficult to lower the contact resistance between the vias 901 and the element 900.

Further, in the semiconductor devices disclosed in Japanese Laid-Open Patent Publication Nos. 2003-273220 and 2004-128498, the vias 901 penetrate through the element 900. With this arrangement, it is necessary to form via holes that penetrate through the element 900, after the element 900 is formed. Etching is performed to form the via holes. However, the material forming the element 900 completely differs from the material forming an insulating layer 905. Therefore, the portions 900A of the element 900 exposed through the inner surfaces of via holes H might be etched during the etching process, as shown in FIG. 5. In this case, it is difficult to fill the etched portions 900A with the metal forming the vias 901. As a result, there might be variations in the contact resistance between the vias 901 and the element 900, or the contact resistance might become higher.

As described above, conventional semiconductor devices are poor in manufacturing stability.

SUMMARY

In one embodiment, there is provided a semiconductor device that includes: an upper interconnect; a lower interconnect that is placed below the upper interconnect; an insulating layer that is placed between the upper interconnect and the lower interconnect; a connecting portion that is formed in the insulating layer and connects the upper interconnect and the lower interconnect; and an element that is placed in the insulating layer and has a conductive layer connected to the connecting portion. The connecting portion is placed over the lower interconnect and an end portion of the conductive layer, and is in contact with the upper face of the lower interconnect, and the upper face and side face of the end portion of the conductive layer of the element.

According to this invention, the connecting portion is formed over the lower interconnect and an end portion of the conductive layer of the element, and is in contact with the upper face of the lower interconnect and the upper face and side face of the end portion of the conductive layer of the element.

Since the connecting portion is in contact with the end portion of the conductive layer of the element in this invention, and a via does not penetrate through the element as in conventional cases, there is no need to form a via hole that penetrates through the conductive layer of the element. As described above, when a via hole that penetrates through the element is formed, the contact resistance between the via and the element varies or becomes higher. In this invention, on the other hand, there is no need to form a via hole that penetrates through the conductive layer of the element, and accordingly, a variation and an increase in the contact resistance can be prevented. Thus, a semiconductor device with excellent manufacturing stability can be obtained.

Also, since the connecting portion is in contact with the side face and upper face of the end portion of the conductive layer of the element in this embodiment, a sufficient contact area between the conductive layer of the element and the connecting portion can be secured. With this arrangement, the contact resistance between the connecting portion and the element can be made lower.

In another embodiment, there is provided a method for manufacturing a semiconductor device. This method includes: forming a lower interconnect in an insulating layer; placing an element having a conductive layer over the insulating layer; providing a second insulating layer over the element; forming a hole in the second insulating layer, the hole exposing an upper face and a side face of an end portion of the conductive layer forming the element, and an upper face of the lower interconnect; forming a connecting portion inside the hole and an upper interconnect over the second insulating layer, the connecting portion being placed over the lower interconnect and the end portion of the conductive layer of the element, the connecting portion being in contact with the upper face of the lower interconnect and the upper face and the side face of the end portion of the conductive layer of the element, the upper interconnect being connected to the connecting portion.

According to this method, the above described semiconductor device can be manufactured.

The present invention provides a semiconductor device that has excellent manufacturing stability and has lower contact resistance.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
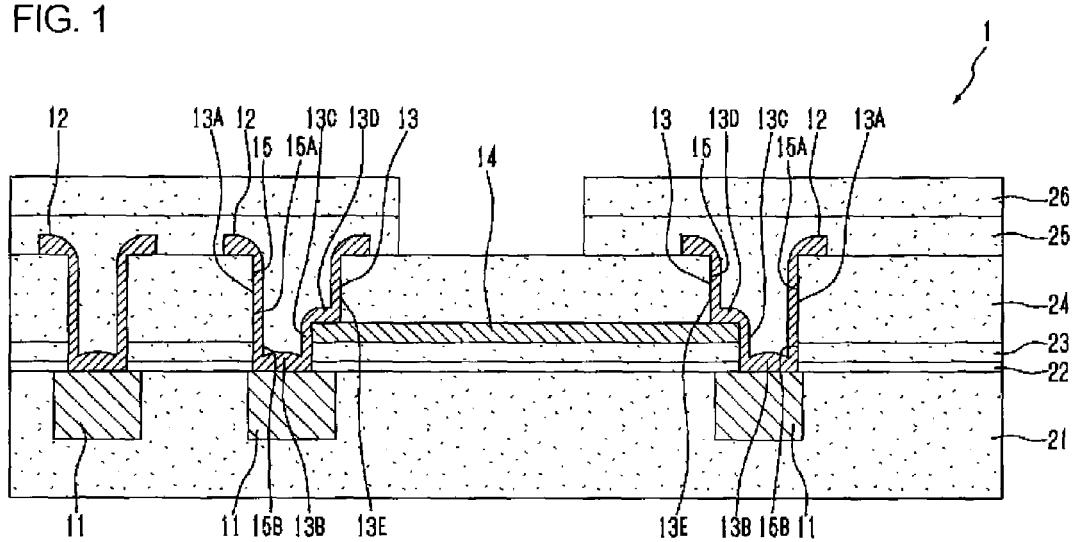
FIG. 1 is a cross-sectional view of a semiconductor device according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following is a description of an embodiment of the present invention, with reference to the accompanying drawings. In the drawings, like components are denoted by like reference numerals, and description of them will not be repeated.

First Embodiment

Referring to FIG. 1, a first embodiment of the present invention is briefly described.

A semiconductor device 1 of this embodiment includes an upper interconnect 12, a lower interconnect 11, insulating layers 22 through 24 that are placed between the upper interconnect 12 and the lower interconnect 11, a connecting portion 13 that is formed in the insulating layer 22 through 24 and connects the upper interconnect 12 to the lower interconnect 11, and an element 14 that is placed in the insulating layer 24 and has a conductive layer connected to the connecting portion 13.

The connecting portion 13 is placed over the lower interconnect 11 and the end portion of the conductive layer of the element 14. The connecting portions 13 is in contact with the upper face of the lower interconnect 11, the upper face of the end portion of the conductive layer of the element 14, and the side face of the end portion of the conductive layer of the element 14.

Referring now to FIG. 1, the semiconductor device 1 of this embodiment is described in detail.

This semiconductor device 1 includes a substrate (a semiconductor substrate) (not shown), insulating layers 21 through 26 stacked on the substrate, the lower interconnects 11, the upper interconnects 12, the connecting portions 13, and the fuse element 14.

The lower interconnect 11 may be Cu interconnect, for example, and is formed in the first insulating layer 21. The first insulating layer 21 may be formed with a low dielectric constant film such as a SiOC film, for example. Other than SiOC, the low dielectric constant film may be made of a polyhydrogen siloxane such as HSQ (hydrogen silsesquioxane), MSQ (methyl silsesquioxane), or MHSQ (methylated hydrogen silsesquioxane), an aromatic-containing organic material such as polyaryl ether (PAE), divinylsiloxane-bis-benzocyclobutene (BCB), or Silk (a registered trade name), SOG, FOX (flowable oxide), CYTOP, BCB (benzocyclobutene), or the like. The low-permittivity film may be a porous film made of one of those materials.

The second insulating layer 22 is stacked on the first insulating layer 21. This second insulating layer 22 may be made of SiCN, SiN, SiC, SiOF, or SiON, for example.

The third insulating layer 23 is stacked on the second insulating layer 22, and the fuse element 14 is placed on the third insulating layer 23.

The third insulating layer 23 may be formed with a low-permittivity film such as a SiOC film.

The fourth insulating layer 24 is further formed on the third insulating layer 23, and the fourth insulating layer 24 covers the fuse element 14. The fourth insulating layer 24 may be formed with a low dielectric constant film such as a SiOC film.

The upper interconnects 12 are formed on the fourth insulating layer 24, and the fifth insulating layer 25 is provided so as to cover the upper interconnects 12. The fifth insulating layer 25 may be made of SiCN, SiN, SiC, SiOF, or SiON, for example.

The sixth insulating layer 26 formed with a polyimide film is further formed on the fifth insulating layer 25.

The fifth insulating layer 25 and the sixth insulating layer 26 have an opening at the location corresponding to the fuse element 14 in a plan view seen from the substrate surface.

The fuse element 14 is formed with a conductive layer such as a TiN layer. The fuse element 14 is a laser fuse that is fused by a laser when necessary.

In a plan view seen from the substrate surface, the fuse element 14 is placed between a pair of lower interconnects 11. The fuse element 14 extends in a direction perpendicular to the extending direction of the lower interconnects 11 (the depth direction of FIG. 1). In the plan view seen from the substrate surface, the two end portions of the fuse element 14 and the pair of lower interconnects 11 sandwiching the fuse element 14 are arranged in an overlapping fashion.

The connecting portion 13 connects the lower interconnect 11 and the upper interconnect 12. The connecting portion 13 is formed inside hole 15 that extends from the fourth insulating layer 24 to the surface of the first insulating layer 21.

The upper face of the lower interconnect 11 and the side face and the upper face of the fuse element 14 are exposed through the inner surfaces of the hole 15. The hole 15 is formed so as not to penetrate through the fuse element 14.

Each of the holes 15 is formed with a first portion 15A that extends from the fourth insulating layer 24 to the upper face of an end portion of the fuse element 14, and a second portion 15B that extends from the end portion of the fuse element 14 to the upper face of the lower interconnect 11. The diameter of the first portion 15A (the width of the first portion 15A in FIG. 1) is larger than the diameter of the second portion 15B (the width of the second portion 15B in FIG. 1).

The connecting portion 13 is formed along the inner surface of the hole 15, so as to cover the inner surface of the hole 15. In other words, the connecting portion 13 is formed into film-like portion, so as not to completely fill the hole 15. More specifically, the connecting portion 13 is a conductive film that is formed by sputtering, and may be an aluminum film, for example. Each of the connecting portions 13 includes a first film (a second portion) 13A that covers the insulating layer 24 and 23 forming part of the sidewall of the hole 15, a second film 13B that covers the upper face of the lower interconnect 11, a third film (a first portion) 13C that covers the insulating layer 23 forming part of the sidewall of the hole 15 and the side face of the end portion of the fuse element 14, a fourth film (a third portion) 13D that covers the upper face of the end portion of the fuse element 14, and a fifth film 13E that covers the insulating layer 24 serving as part of the sidewall of the hole 15.

The first films 13A through the fifth film 13E are formed in a continuous fashion.

While the maximum thickness of the second film 13B (the thickness measured from the upper face of the lower interconnect 11) and the maximum thickness of the fourth film 13D (the thickness measured from the upper face of the end portion of the fuse element 14) are both approximately 1.6 µm, the maximum thickness of the first film 13A (the thickness measured from the sidewall of the hole 15 (or from the insulating layer 23 or 24)), the maximum thickness of the third film 13C (the thickness from the insulating layer 23 or the side face of the end portion of the fuse element 14), and the maximum thickness of the fifth film 13E (the thickness measured from the sidewall of the hole 15 (or from the insulating layer 24) are in the range of approximately 100 to 600 nm and are smaller than the maximum thicknesses of the second film 13B and the fourth film 13D.

Among the faces forming the inner surfaces of the hole 15, the side face of the end portion of the fuse element 14 and the insulating layer 24 face each other, and the third film 13C covering the side face of the end portion of the fuse element 14 and the first film 13A covering the insulating layer 24 face each other. The first film 13A and the third film 13C are formed at a distance from each other, so as not to be in contact with each other. A space is formed between the first film 13A and the third film 13C. This space is filled with the fifth insulating layer 25.

Likewise, the first film 13A and the fifth film 13E facing each other have such thicknesses as not to be in contact with each other, and a space is also formed between those films 13A and 13E. This space is filled with the fifth insulating layer 25.

The upper interconnect 12, along with the connecting portion 13, is formed by sputtering, and is formed integrally with the connecting portion 13. In this embodiment, the upper interconnect 12 is an aluminum interconnect that is formed by sputtering. The upper interconnect 12 is placed on the fourth insulating layer 24, and is connected to the lower interconnect 11 via the connecting portion 13.

The fifth insulating layer 25 covering the upper interconnects 12 is formed to also cover the upper portions of the connecting portions 13, and fill the inside of the holes 15. The region inside the connecting portion 13 may be completely filled with the fifth insulating layer 25, or space may be formed between the inner face of the connecting portion 13 and the fifth insulating layer 25.

The upper interconnect 12 is the uppermost interconnect in the semiconductor device 1.

Next, a method for manufacturing the semiconductor device 1 of this embodiment is described.

The first insulating layer 21 is formed on a semiconductor substrate, and interconnect trenches are formed in the first insulating layer 21. The interconnect trenches are filled with a conductive material, so as to form the lower interconnects 11.

The second insulating layer 22 and the third insulating layer 23 are stacked, and the conductive layer to form the fuse element 14 is formed on the third insulating layer 23. Etching is then selectively performed in conformity with the pattern of the fuse element 14.

After that, the fourth insulating layer 24 is stacked.

Selective etching is then performed on the fourth insulating layer 24, the third insulating layer 23, and the second insulating layer 22, so as to form the holes 15. The hole 15 is formed to expose the upper face of the lower interconnect 11 and the side face and upper face of the end portions of the fuse element 14.

The connecting portion 13 is formed by Al sputtering inside the hole 15, and the upper interconnect 12 is formed.

The fifth insulating layer 25 and the sixth insulating layer 26 are then formed.

Through the above procedures, the semiconductor device 1 is completed.

Next, the advantages of this embodiment are described.

The connecting portion 13 is formed over the lower interconnect 11 and the end portion of the conductive layer of the fuse element 14, and is in contact with the upper face of the lower interconnect 11 and the upper face and side face of the end portion of the conductive layer of the fuse element 14.

In this embodiment, the hole 15 for forming the connecting portion 13 is formed so as to expose the side face and upper face of the end portion of the conductive layer of the fuse element 14. The connecting portion 13 is formed so as to be in contact with the upper face and side face of the end portion of the conductive layer of the fuse element 14, and there is no need to form via hole that penetrates through the conductive layer of an element as in conventional cases. Where via hole that penetrates through the element is formed, there are variations in the contact resistance of the via and the element, or the contact resistance becomes higher. In this embodiment, on the other hand, there is no need to form the via hole that penetrates through the fuse element 14. Accordingly, variations in the contact resistance and an increase in the contact resistance can be prevented, and excellent manufacturing stability can be achieved.

Since the connecting portion 13 is in contact with the side face and upper face of the conductive layer of the fuse element 14, and sufficient contact area between the conductive layer of the element 14 and the connecting portion 13 can be secured. With this arrangement, the contact resistance between the connecting portion 13 and the fuse element 14 can be made lower.

Further, in this embodiment, the connecting portion 13 is formed by sputtering. When the connecting portion 13 is formed by sputtering, the part of the connecting portion 13 formed on the upper face of the end portion of the conductive layer of the fuse element 14 and the part of the connecting portion 13 formed on the upper face of the lower interconnect 11 are relatively thick, and the part of the connecting portion 13 formed on the side face of the end portion of the conductive layer of the fuse element 14 is relatively thin. For example, the thickness measured from side face of the end portion of the conductive layer of the third film 13C is smaller than the thickness measured from upper face of the end portion of the conductive layer of the fourth film 13D.

Accordingly, the conductive layer and the connecting portion 13 can be certainly connected by forming the connecting portion 13 on the upper faces of the end portion of the conductive layer of the fuse element 14, and the contact resistance can be made lower.

In this embodiment, the fuse element 14 is connected to the connecting portion 13 that connects the upper interconnect 12 to the lower interconnect 11. Accordingly, the fuse element 14 may be connected to another interconnect by selecting either the upper interconnect 12 or the lower interconnect 11.

Further, in this embodiment, the end portion of the conductive layer of the fuse element 14 overlaps with the lower interconnect 11 in a plan view. Accordingly, the diameter of the hole 15 for forming the connecting portion 13 can be made smaller, and the area of the hole 15 can be made smaller when seen from the substrate surface.

Second Embodiment

Figure 2:
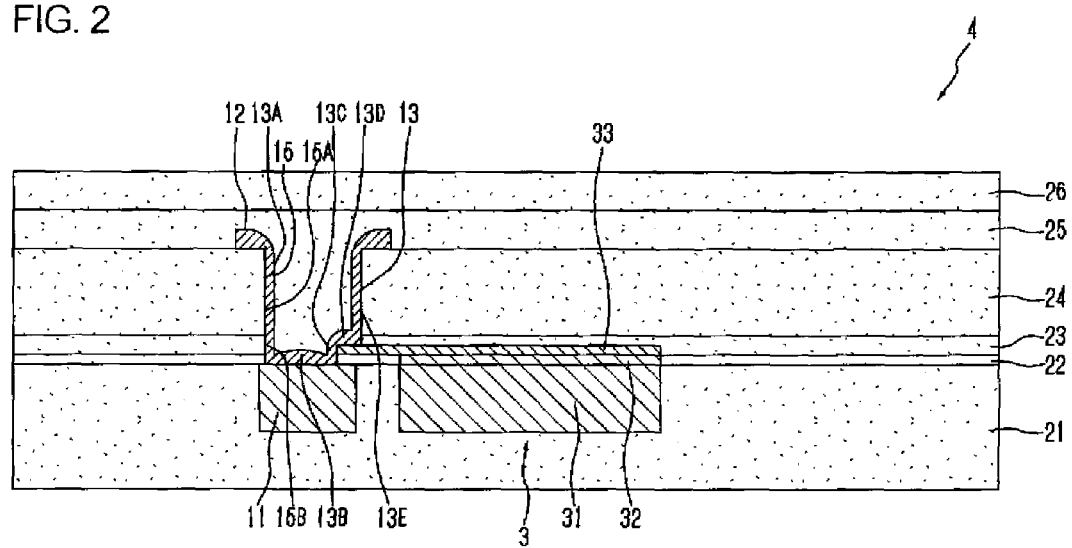
FIG. 2 is a cross-sectional view of a semiconductor device according to a second embodiment of the present invention.

Referring to FIG. 2, a semiconductor device 4 of this embodiment is described.

In the foregoing embodiment, the element is the fuse element 14. In this embodiment, on the other hand, the element is a MIM (metal-insulator-metal) capacitor 3. The other aspects of this embodiment are the same as those of the foregoing embodiment.

The MIM capacitor 3 includes a lower electrode 31 that is formed in the first insulating layer 21, a dielectric film 32 that is provided on the lower electrode 31, and an upper electrode (a conductive layer) 33 that is provided on the dielectric film 32.

The lower electrode 31 is made of the same material as the lower interconnect 11, and may be made of copper, for example.

In this embodiment, the lower electrode 31 is made of the same material as the lower interconnect 11, but may be made of a different material from the lower electrode 31.

For example, the lower electrode 31 may be a metal film that is formed by stacking Ti, TiN, Al, Ti, and TiN in this order from the bottom.

The dielectric film 32 functions as a capacitor film of a capacitor. Examples of materials that may form the dielectric film 32 include not only $SiO_2$, SiON, SiOC, SiN, $Ta_2O_5$, and the likes, but also so-called high-k materials such as $ZrO_x$, $HfO_x$, $ZrSiO_x$, $HfSiO_x$, and $Al_2O_3$, and materials each having a perovskite structure such as PZT and PLZT.

The dielectric film 32 is formed in the insulating layer 22, and covers the lower electrode 31.

The upper electrode 33 covers the dielectric film 32, and has an end portion that protrudes toward a side from the dielectric film 32 and is located on the insulating layer 22. The upper electrode 33 may be made of TaN, TiN, Ta, W, or the like.

The connecting portion 13 covers the upper face of the lower interconnect 11, and also covers the upper face and the side face of an end portion of the upper electrode 33.

The connecting portion 13 has substantially the same structure of that of the foregoing embodiment. The connecting portion 13 includes a first film 13A that covers the insulating layers 24, 23, and 22 forming part of the sidewall of the hole 15, a second film 13B that covers the upper face of the lower-layer electrode 11, a third film 13C that covers the insulating layer 22 forming part of the sidewall of the hole 15 and the side face of the end portion of the upper electrode 33, a fourth film 13D that covers the upper face of the end portion of the upper electrode 33, and a fifth film 13E that covers the insulating layers 23 and 24 serving as part of the sidewall of the hole 15.

The first film 13A through the fifth film 13E are formed in a continuous fashion.

The thicknesses of the films 13A through 13E are the same as those of the foregoing embodiment.

Although the first film 13A and the third film 13C face each other, the first film 13A and the third film 13C are formed at a distance from each other, so as not to be in contact with each other. A space is formed between the first film 13A and the third film 13C. This space is filled with the fifth insulating layer 25.

Likewise, the first film 13A and the fifth film 13E have such thicknesses as not to be in contact with each other, and a space is also formed between those films 13A and 13E. This space is filled with the fifth insulating layer 25.

The semiconductor device 4 is manufactured in the following manner.

Etching is performed on the first insulating layer 21, so as to form an interconnect trench and a trench for the lower electrode.

A metal film is then formed to fill the interconnect trench and the trench for the lower electrode. After that, the metal film is selectively removed, so as to form the lower interconnect 11 and the lower electrode 31. The dielectric film 32 is then formed by CVD or the like, and the second insulating layer 22 is further formed.

The upper electrode 33 is then formed on the dielectric film 32 by sputtering.

After that, the third insulating layer 23 is formed to bury the upper electrode 33.

The fourth insulating layer 24 is then formed, and etching is performed to form the hole 15 for forming the connecting portion 13. The hole 15 is formed by performing selective etching on the fourth insulating layer 24, the third insulating layer 23, and the second insulating layer 22. The hole 15 is formed to expose the upper face of the lower interconnect 11, and the upper face and side face of the end portion of the upper electrode 33.

The hole 15 has the same shape as that of the foregoing embodiment, and is formed with a first portion 15A that extends from the fourth insulating layer 24 to the upper face of the end portion of the upper electrode 33, and a second portion 15B that extends from the end portion of the upper electrode 33 to the upper face of the lower interconnect 11. The diameter of the first portion 15A (the width of the first portion 15A in FIG. 2) is larger than the diameter of the second portion 15B (the width of the second portion 15B in FIG. 2).

After that, as in the foregoing embodiment, the connecting portion 13 in the hole 15 and the upper interconnect 12 are formed by Al sputtering. The fifth insulating layer 25 and the sixth insulating layer 26 are then formed.

This embodiment can achieve the same effects as those of the first embodiment.

The present invention is not limited to the above embodiments, and includes modifications and changes within the scope of the invention.

For example, the upper interconnect 12 is the uppermost interconnect, but the present invention is not limited to that arrangement.

In each of the embodiments, each connecting portion 13 is formed by sputtering, and is formed with a film that covers the inner surface of the hole 15. However, the present invention is not limited to that arrangement.

Figure 3:
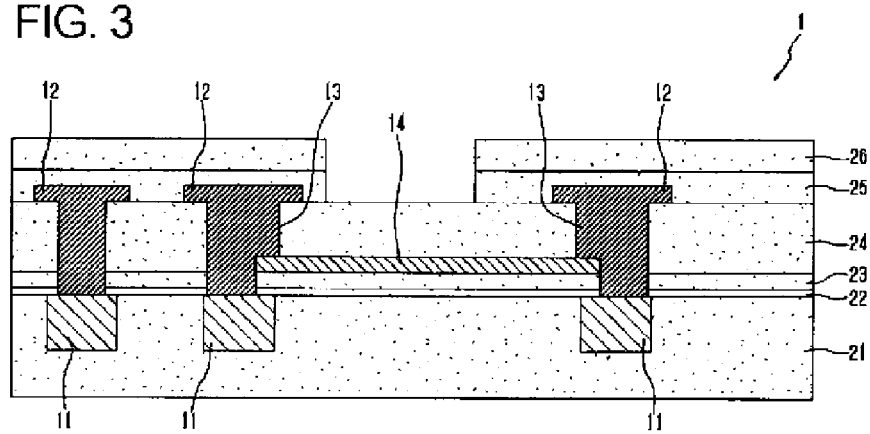
FIG. 3 is a cross-sectional view of a semiconductor device according to a modification of the present invention.
Figure 4:
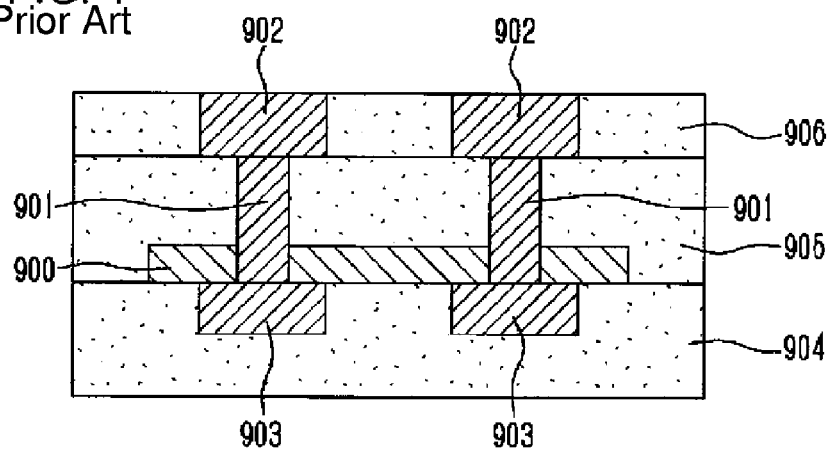
FIG. 4 illustrates a conventional semiconductor device.
Figure 5:
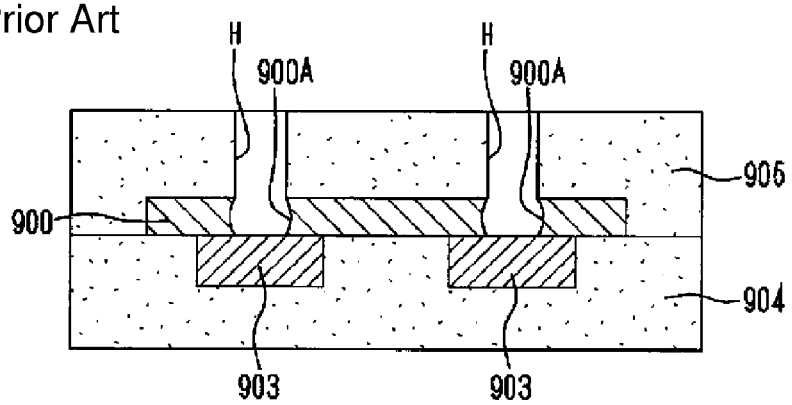
FIG. 5 illustrates the conventional semiconductor device.

For example, the connecting portion 13 may be via that is formed by a damascene process or the like, as shown in FIG. 3.

In such a case, there is no need to form a hole that penetrates through the conductive layer of the element as in a conventional case. Accordingly, a semiconductor device with excellent manufacturing stability can be formed. Also, since the connecting portion 13 covers the side face and upper face of the end portion of the conductive layer, the contact resistance between the element 14 and the connecting portion 13 can be made lower.

Further, in the above embodiments, the element is the fuse element 14 or the MIM element 3. However, the present invention is not limited to that arrangement.

In the second embodiment, an end portion of the upper electrode 33 extends to the upper portion of the lower interconnect 11. However, an end portion of the dielectric film 32, as well as the end portion of the upper electrode 33, may extend to the upper portion of the lower interconnect 11.

Further, in the second embodiment, the end portion of the upper electrode 33 is connected to the connecting portion 13. However, an end portion of the lower electrode may be connected to the connecting portion. The connecting portion may be brought into contact with the upper face and the side face of the end portion of the lower electrode. In this case, the lower electrode should be formed at a higher position than the lower interconnect.

It is apparent that the present invention is not limited to the above embodiment, and may be modified and changed without departing from the scope and spirit of the invention.

According to this invention, there is provided a method for manufacturing a semiconductor device, comprising:

forming a lower interconnect in an insulating layer;

placing an element having a conductive layer over said insulating layer;

providing a second insulating layer over said element;

forming a hole in said second insulating layer, said hole exposing an upper face and a side face of an end portion of said conductive layer of said element, and an upper face of said lower interconnect;

forming a connecting portion inside said hole and an upper interconnect over said second insulating layer, said connecting portion being placed over said lower interconnect and said end portion of said conductive layer of said element, said connecting portion being in contact with said upper face of said lower interconnect and an upper face and a side face of said end portion of said conductive layer of said element, said upper interconnect being connected to said connecting portion.

What is claimed is:

1. A semiconductor device, comprising:
an upper interconnect formed of a material;
a lower interconnect that is placed below said upper interconnect;
an insulating layer that is placed between said upper interconnect and said lower interconnect;
a connecting portion that is formed in said insulating layer over said lower interconnect and connects said upper interconnect and said lower interconnect, wherein said connecting portion is formed with the material of the upper interconnect;
a fuse element that is placed in said insulating layer and has a conductive layer connected to said connecting portion, said fuse element having an outermost perimeter, and said connecting portion located adjacent to an end portion of said conductive layer on said outermost perimeter, said connecting portion being in contact with less than an entirety of an upper face of said lower interconnect, and also in contact with an upper face and a side face of said end portion on said outermost perimeter of said conductive layer of said element;
a hole formed in said insulating layer exposing said upper face of said lower interconnect, and said side face and upper face of said conductive layer of said fuse element; and
another insulating layer that covers said upper interconnect,
wherein said connecting portion is formed along an inner surface of said hole, and said another insulating layer fills the region inside the connecting portion.

2. The semiconductor device according to claim 1, wherein said material forming the upper interconnect and the connecting portion is an aluminum film.

3. The semiconductor device according to claim 1, wherein said lower interconnect is formed in another insulating layer that is placed below said insulating layer.

4. The semiconductor device according to claim 1, wherein said connecting portion is a conductive film that covers said upper face of said lower interconnect, and said side face and upper face of said conductive layer of said element.

5. The semiconductor device according to claim 4, wherein, in said conductive film, a first portion that covers said side face of said end portion of said conductive layer of said element is located at a distance from a second portion that covers a region of said inner surface of said hole, the region facing said side face of said end portion of said conductive layer of said element.

6. The semiconductor device according to claim 1, wherein said hole includes a first portion having a first width and a second portion having a second width different from said first width.

7. The semiconductor device according to claim 6, wherein said first portion is defined by a first sidewall portion of said insulating layer and said side face of said end portion of said conductive layer of said element.

8. The semiconductor device according to claim 7, wherein said second portion is defined by said first sidewall portion and a second sidewall portion of said insulating layer, said second sidewall portion disposed above said upper face of said end portion of said conductive layer of said element.

9. The semiconductor device according to claim 1, wherein the element is free of any via holes where the element fully encircles the connecting portion.

10. A semiconductor device, comprising:
upper and lower interconnects, wherein the upper interconnect is formed of a material;
an insulating layer disposed between said upper and lower interconnects;
a connecting portion disposed within said insulating layer and electrically interconnecting said upper and lower interconnects, wherein said connecting portion is formed with the material of the upper interconnect;
a fuse element disposed within said insulating layer and having a conductive layer connected to said connecting portion;
a hole formed in said insulating layer exposing an upper face of said lower interconnect, and a side face and upper face of said conductive layer of said fuse element; and
another insulating layer that covers said upper interconnect,
wherein said connecting portion is disposed over both said lower interconnect and said upper face of an end portion of said conductive layer located on an outermost perimeter of said conductive layer,
wherein said connecting portion is in contact with said side face of said end portion of said conductive layer,
wherein said end portion of said conductive layer overlaps said lower interconnect, and
wherein said connecting portion is formed along an inner surface of said hole, and said another insulating layer fills the region inside the connecting portion.

11. The semiconductor device according to claim 10, wherein said hole includes a first portion having a first width and a second portion having a second width different from said first width.

12. The semiconductor device according to claim 11, wherein said first portion is defined by a first sidewall portion of said insulating layer and said side face of said end portion of said conductive layer of said element.

13. The semiconductor device according to claim 12, wherein said second portion is defined by said first sidewall portion and a second sidewall portion of said insulating layer, said second sidewall portion disposed above said upper face of said end portion of said conductive layer of said element.

14. The semiconductor device according to claim 10, wherein said fuse element is a laser fuse.

* * * * *